US009723767B2

(12) United States Patent
Kojima et al.

(10) Patent No.: US 9,723,767 B2
(45) Date of Patent: Aug. 1, 2017

(54) NETWORK DEVICE AND COMMUNICATION MODULE (75) Inventors: Toshiyuki Kojima, Kyoto (JP); Megumu Asano, Moriyama (JP)

(73) Assignee: OMRON CORPORATION, Kyoto (JP)

(*) Notice: Subject to any disclaimer, the term of this patent is extended or adjusted under 35 U.S.C. 154(b) by 218 days.

(21) Appl. No.: 13/550,953

(22) Filed: Jul. 17, 2012

(65) Prior Publication Data

US 2013/0010434 A1 Jan. 10, 2013

Related U.S. Application Data (63) Continuation of application No. PCT/JP2011/056224, filed on Mar. 16, 2011.

(30) Foreign Application Priority Data

Jul. 7, 2010 (JP) .................................. 2010-154969

(51) Int. Cl.
*H05K 9/00* (2006.01)
*H01F 19/04* (2006.01)
(Continued)

(52) U.S. Cl.
CPC ............ *H05K 9/006* (2013.01); *H01F 19/04* (2013.01); *H01F 27/36* (2013.01); *H05K 1/0233* (2013.01);
(Continued)

(58) Field of Classification Search
CPC .. H05K 9/0032; H05K 9/0039; H05K 1/0218; H05K 1/021; H05K 1/0212;
(Continued)

(56) References Cited

U.S. PATENT DOCUMENTS 5,014,160 A * 5/1991 McCoy, Jr. ............ H05K 3/308
174/363
5,621,363 A * 4/1997 Ogden et al. .................. 333/12
(Continued)

FOREIGN PATENT DOCUMENTS

JP 56-78427 6/1981
JP 60-169824 11/1985
(Continued)

OTHER PUBLICATIONS

JP 09-116510 English Translation.*
(Continued)

*Primary Examiner* — Pete Lee
(74) *Attorney, Agent, or Firm* — Greenblum & Bernstein, P.L.C.

(57) ABSTRACT

On a circuit board configured to transmit a signal, a pulse transformer is provided on a path used for transmitting the signal of the circuit board. A shield member is provided on the circuit board to prevent noise, which is generated due to noise current flowing in a noise line pattern, from entering the pulse transformer. The shield member covers a part of a surface of at least one pulse transformer, the part intersecting concentric circles (which represent a magnetic field generated by the noise current) whose central axis extends along the direction in which the noise current flows.

8 Claims, 7 Drawing Sheets (51) Int. Cl.
*H01F 27/36* (2006.01)
*H05K 1/02* (2006.01)

(52) U.S. Cl.
CPC ......... *H05K 9/0066* (2013.01); *H05K 1/0218* (2013.01); *H05K 1/0228* (2013.01); *H05K 2201/0723* (2013.01); *H05K 2201/1003* (2013.01); *H05K 2201/10371* (2013.01)

(58) Field of Classification Search
CPC .... H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/18; H05K 1/181; H05K 1/182; H05K 1/183; H05K 1/184; H05K 1/185; H05K 2201/0317; H05K 2201/041; H05K 2201/049; H05K 2201/09763; H05K 2201/10446; H05K 2201/10454; H05K 2201/10462; H05K 2201/10469; H05K 2201/10477; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46; H05K 1/0224; H05K 2201/0707; H05K 2201/10371; H05K 9/0022; H05K 9/0024; H05K 9/0052; H05K 9/0071; H05K 9/0081; H05K 9/0098
USPC .................................................. 361/816, 818
See application file for complete search history.

(56) References Cited

U.S. PATENT DOCUMENTS

| | | | | |
|---|---|---|---|---|
| 6,459,517 B1* | 10/2002 | Duncan et al. | ............... | 398/135 |
| 6,882,542 B2* | 4/2005 | Tamaki et al. | ................ | 361/760 |
| 7,564,834 B1* | 7/2009 | Suder et al. | .................. | 370/352 |
| 2001/0053070 A1* | 12/2001 | Kitamura | ............. | H05K 9/0028 361/818 |
| 2003/0223213 A1* | 12/2003 | Daoud | ................ | H05K 9/0026 361/818 |
| 2004/0057220 A1 | 3/2004 | Tamaki et al. | | |
| 2004/0119654 A1* | 6/2004 | Koyama | ................ | H01Q 1/243 343/846 |
| 2007/0187143 A1* | 8/2007 | Lu | ......................... | H02M 7/003 174/359 |
| 2009/0166081 A1* | 7/2009 | Tsai | ..................... | H05K 9/0032 174/350 |
| 2009/0206951 A1* | 8/2009 | Nakamura | ........... | H05K 1/0233 333/181 |
| 2009/0253300 A1* | 10/2009 | Huang | ............... | H01R 13/6633 439/620.05 |
| 2010/0309644 A1* | 12/2010 | Choi et al. | ..................... | 361/818 |

FOREIGN PATENT DOCUMENTS

| | | |
|---|---|---|
| JP | 61-129806 | 6/1986 |
| JP | 63-250199 | 10/1988 |
| JP | 01-100412 | 7/1989 |
| JP | 4-42722 | 4/1992 |
| JP | 7-192926 | 7/1995 |
| JP | 09-116510 | 5/1997 |
| JP | 08-069927 | 3/1998 |
| JP | 2000-209525 | 7/2000 |
| JP | 2002-270430 | 9/2002 |
| JP | 2002-299132 | 10/2002 |
| JP | 2003-142868 | 5/2003 |
| JP | 2004-356070 | 12/2004 |
| WO | 95/06370 | 3/1995 |

OTHER PUBLICATIONS

JP 09-116510 English Translation with date of publication at Feb. 5, 1997.*
English translation of International Search Report of Jul. 7, 2011.
International Search Report dated Jul. 7, 2011, and English translation.
Japan Office action, dated Apr. 16, 2013 along with an english translation thereof.
Office Action issued in E.P.O. Counterpart Patent Appl. No. 11803361.2.
$2^{nd}$ Office Action issued in China Counterpart Patent Appl. No. 201180006024.2.
$3^{rd}$ Office Action issued in China Counterpart Patent Appl. No. 201180006024.2.

* cited by examiner

NETWORK DEVICE AND COMMUNICATION MODULE

CROSS-REFERENCE TO RELATED APPLICATION

This is a continuation application of PCT/JP2011/056224 filed Mar. 16, 2011, designating the United States of America, the disclosure of which, including the specification, drawings and claims, is incorporated by reference in its entirety. The disclosures of Japanese Patent Application No. 2010-154969 filed on Jul. 7, 2010, including the specifications, drawings, and claims are expressly incorporated herein by reference in its entirety.

TECHNICAL FIELD

The present invention relates to a network device, and particularly to a structure for addressing noise of a pulse transformer used in the network device and a communication module.

BACKGROUND ART

A network system typified by LAN (Local Area Network) is constructed of various network devices such as hub. Such network devices are required to address noise for the sake of reliability of communication.

For example, PTL 1 (Japanese Patent Laying-Open No. 9-116510) discloses an interface module with the aim of downsizing the shape and reducing crosstalk. This interface module includes a reception unit and a transmission unit. The reception unit and the transmission unit are each constituted of a low-pass filter, a pulse transformer, and a choke transformer. The low-pass filter is provided for removing a harmonic component (normal-mode noise) and the choke transformer is provided for removing common-mode noise. Further, a shield plate is disposed between the reception unit and the transmission unit.

The above-described network device commonly has a pulse transformer therein. For example, PTL 2 (Japanese Patent Laying-Open No. 61-129806) discloses a structure of the pulse transformer with the aim of suppressing radiation noise, which cannot be suppressed by the pulse transformer, by means of a shield. This pulse transformer includes first and second shield plates that are electrically insulated and arranged opposite to each other with a predetermined distance therebetween, a core member having a predetermined shape and disposed at a predetermined position of the shield plates so that the core member extends through the shield plates, a plurality of windings wound around opposite portions of the core member that are located on the first shield plate and the second shield plate respectively, and a shield member provided to surround a part of the second shield plate. The first shield plate is connected to a case of the device, and the second shield plate is connected via the shield member to an external conductor of a transmission cable having an internal conductor to which one of the windings is connected. Since a signal source includes noise, the pulse transformer is shielded to thereby suppress noise radiation from the cable.

Further, PTL 3 (Japanese Patent Laying-Open No. 2002-270430) for example discloses a structure of the pulse transformer. According to PTL 3, a linear conductor extends through the center of a ring-shaped core to form a primary winding. Around the linear conductor, a plurality of electrostatic shield conductors are arranged. The plurality of electrostatic shield conductors are divided into two groups. A line drawn from one of the groups to the ground is disposed in the opposite direction to a line drawn from the other group to the ground. It is noted that the pulse transformer disclosed in PTL 3 is used in an application for driving the gate of a DC high-voltage switch which is used for a high-voltage pulse generator or the like.

Further, another example of how to address noise is provided for example by PTL 4 (Japanese Patent Laying-Open No. 2004-356070) which discloses a structure for addressing noise of a discharge lamp. More specifically, a part of the discharge lamp socket is covered with a shield cover.

Further, PTL 5 (Japanese Patent Laying-Open No. 63-250199) for example discloses a system for addressing noise of a circuit board on which a transformer is mounted. Specifically, in a region of a substrate surface corresponding to a peripheral portion of the transformer which is a noise source, a pattern is formed in which at least one short-circuit or low-resistance loop is drawn. In this way, the leakage inductance is damped and therefore noise can be lessened.

CITATION LIST

Patent Literature

PTL 1: Japanese Patent Laying-Open No. 9-116510
PTL 2: Japanese Patent Laying-Open No. 61-129806
PTL 3: Japanese Patent Laying-Open No. 2002-270430
PTL 4: Japanese Patent Laying-Open No. 2004-356070
PTL 5: Japanese Patent Laying-Open No. 63-250199

SUMMARY OF INVENTION

Technical Problem

As described above, the conventional art provides a method for blocking noise, such as a method that covers the whole circuit board with a shield plate, or a method that uses an electronic component such as common-mode choke coil, transformer, or capacitor. In the case of the method that covers the whole circuit with a shield plate, however, the shield plate having a large area is necessary, resulting in a high cost of the shield plate. In addition, the method that covers the whole circuit board with a shield plate cannot exhibit the effect of preventing noise if, for example, a noise source is present in the circuit board or noise has already entered the circuit. As for the case where noise is addressed by means of an electronic component only such as common-mode choke coil, transformer, or capacitor without using the shield plate, the noise tolerance is difficult to increase.

Further, due to some reason involved in manufacture of the pulse transformer, noise characteristics may vary from one pulse transformer to another. For example, due to a difference in shape of a winding that occurs when a conductor is wound around a core, or a difference in orientation of the core that occurs when the pulse transformer is placed in a case (package), a difference in noise characteristics may occur. The above-referenced patent literatures, however, do not disclose at all the possibility that such a difference in noise characteristics occurs.

Furthermore, recently a network device connected to a LAN cable such as switching hub has been equipped with the capability (called AutoMDI/MDI-X) of automatically recognizing whether the LAN cable connected to the device is a straight cable or a cross cable. In the case of the device of this type, depending on the connected LAN cable, a transmitter circuit is switched to a receiver circuit and a receiver circuit is switched to a transmitter circuit. In such a configuration in which the transmitter circuit switches to the receiver circuit and the receiver circuit switches to the transmitter circuit depending on the type of the LAN cable connected to the device, the direction in which a signal is transmitted is also switched. The measure against noise by means of an electronic component only is effective in most cases on the condition that the direction in which a signal is transmitted is fixed, and therefore, the measure against noise may be inadequate for addressing noise.

Thus, the conventional art has a problem of difficulty in supressing, effectively and at a low cost, noise entering a pulse transformer used in a network device or communication module.

An object of the present invention is to provide a configuration for enabling effective and low-cost suppression of noise entering a pulse transformer included in a network device.

SOLUTION TO PROBLEM

According to an aspect of the present invention, a network device provided on a communication network and transmitting a signal via a communication cable includes a circuit board for transmitting a signal; at least one pulse transformer provided on a path for transmitting a signal of the circuit board; and a shield member provided in association with the at least one pulse transformer for preventing noise which is generated due to noise current from entering the at least one pulse transformer. The shield member covers a surface portion of the at least one pulse transformer that intersects concentric circles (which represent a magnetic field generated by noise current) having a central axis extending along a direction in which the noise current flows.

Preferably, the at least one pulse transformer includes: a first pulse transformer for passing a signal received by the network device via the communication cable; and a second pulse transformer for passing a signal transmitted from the network device to the communication cable.

Preferably, the circuit board includes a line pattern for passing the noise current entering the network device. The first and second pulse transformers are housed in a package mounted on the circuit board. The shield member covers an upper surface of the package and a side of the package that is located opposite to the line pattern.

Preferably, the shield member is electrically connected to a node having a fixed potential.

Preferably, the shield member is mounted on the circuit board in a state where the shield member is electrically floated.

According to another aspect of the present invention, a communication module transmitting a signal via a communication cable includes: a circuit board for transmitting a signal; at least one pulse transformer mounted on the circuit board and provided on a path for transmitting a signal; and a shield member provided in association with the at least one pulse transformer for preventing noise generated due to noise current from entering the at least one pulse transformer. The shield member covers a surface portion of the at least one pulse transformer that intersects concentric circles having a central axis extending along a direction in which the noise current flows.

Advantageous Effects of Invention

According to the present invention, noise entering a pulse transformer can be suppressed effectively and at a low cost.

DESCRIPTION OF EMBODIMENTS

In the following, an embodiment of the present invention will be described in detail with reference to the drawings. In the drawings, the same or corresponding components are denoted by the same reference characters, and a description thereof will not be repeated.

Figure 1:
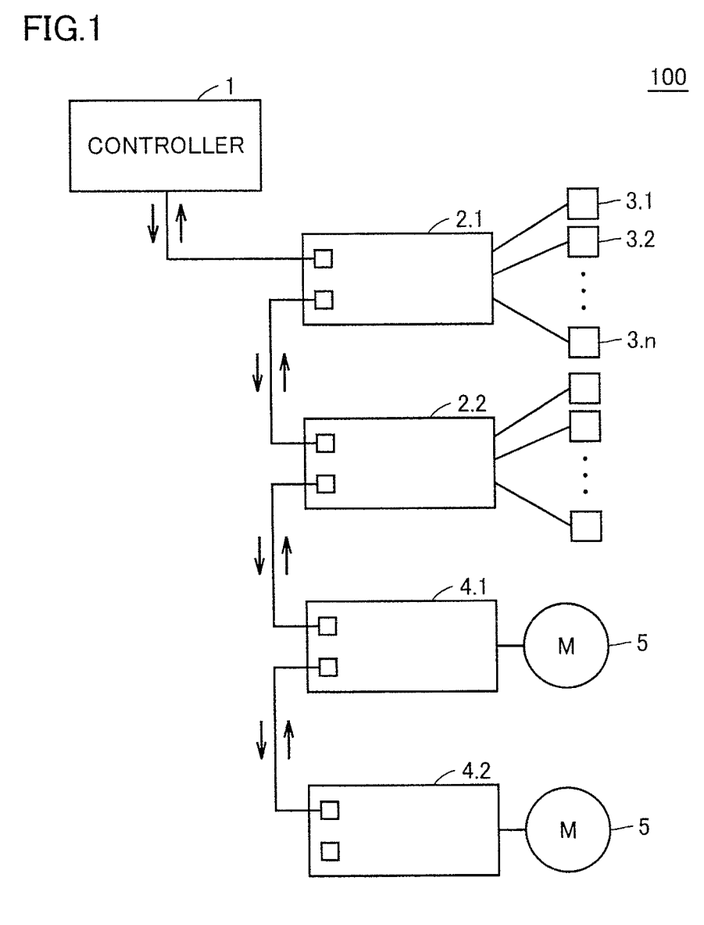
FIG. 1 is a diagram showing one example configuration of a network system including network devices according to an embodiment of the present invention.

FIG. 1 is a diagram showing one example configuration of a network system including network devices according to the embodiment of the present invention. Referring to FIG. 1, network system 100 is used as a system for driving and controlling various machines and apparatuses (not shown) in a factory.

In the present embodiment, network system 100 is constructed as a system conforming to the industrial Ethernet® protocol. Network system 100 includes a controller 1, network devices 2.1, 2.2, input/output devices 3.1 to 3.n, servo drivers 4.1, 4.2, and a servo motor 5.

Network devices 2.1, 2.2 are each a remote I/O for example. To network devices 2.1, 2.2 each, input/output devices (such as sensor and actuator) controlled by controller 1 are connected. For example, to network device 2.1, input/output devices 3.1, 3.2, ..., 3.n are connected. Here, the number of input/output devices connected to each of network devices 2.1, 2.2 is not particularly limited. To servo drivers 4.1, 4.2 each, servo motor 5 is connected.

Controller 1, network devices 2.1, 2.2, and servo drivers 4.1, 4.2 are daisy-chain-connected by a communication cable. In this system, controller 1 is a master and other devices are slaves. In order to improve the efficiency of transmission between the master and the slaves, the above-referenced protocol employs a transmission and reception scheme of flowing a data frame in the form of a continuous flow. Namely, a data frame which is transmitted from controller 1 flows through network devices 2.1, 2.2 and servo drivers 4.1, 4.2 in this order and further flows from servo driver 4.2 through servo driver 4.1 and network devices 2.2, 2.1 in this order to return to controller 1.

Each of network devices 2.1, 2.2 and servo drivers 4.1, 4.2 which are slaves reads data addressed to the slave or writes data when the frame passes through the slave, and transfers the frame data to the subsequent slave. In this way, a mechanism of quickly passing a frame can be established. The quick circulation of data enables a delay to be minimized. Further, the above-described slaves (network devices 2.1, 2.2 and servo drivers 4.1, 4.2) have a capability of synchronizing the input/output timing of data, command or the like to/from the input/output devices such as sensor and the servo drivers with each other. Thus, a plurality of servo motors can be operated in synchronization with each other.

In the network of this form, there are various reasons for a possibility that a signal transmitted through the communication cable is influenced by noise. A frame data is transmitted via the signal. Therefore, if a signal influenced by noise is input to a certain network device, this network device may fail to receive data, for example, cannot receive normal data addressed to the device.

The network according to the embodiment of the present invention employs the mechanism of quickly circulating data. Therefore, if a slave which has failed to receive data requests the master to transmit the data again, a significant delay of the transmission may occur. In such a case, the operation timing of the input/output devices such as sensor and the operation timing of the servo drivers are difficult to match each other.

In the case where a slave fails to receive data addressed to the slave, another measure may be taken such as a method that receives the data addressed to the slave from a subsequently transmitted frame. The data included in the frame, however, concerns control of the input/output devices or servo drivers. Therefore, once the data is discarded, it becomes difficult to match the operation timing of the input/input devices and the operation timing of the servo drivers.

In accordance with the embodiment of the present invention, a network device can be implemented that can suitably be used even in an environment in which data is not permitted to be re-transmitted and therefore it is required to prevent noise from entering the device and prevent noise from being generated in the device. The network device in the embodiment of the present invention will hereinafter be described in detail.

Figure 2:
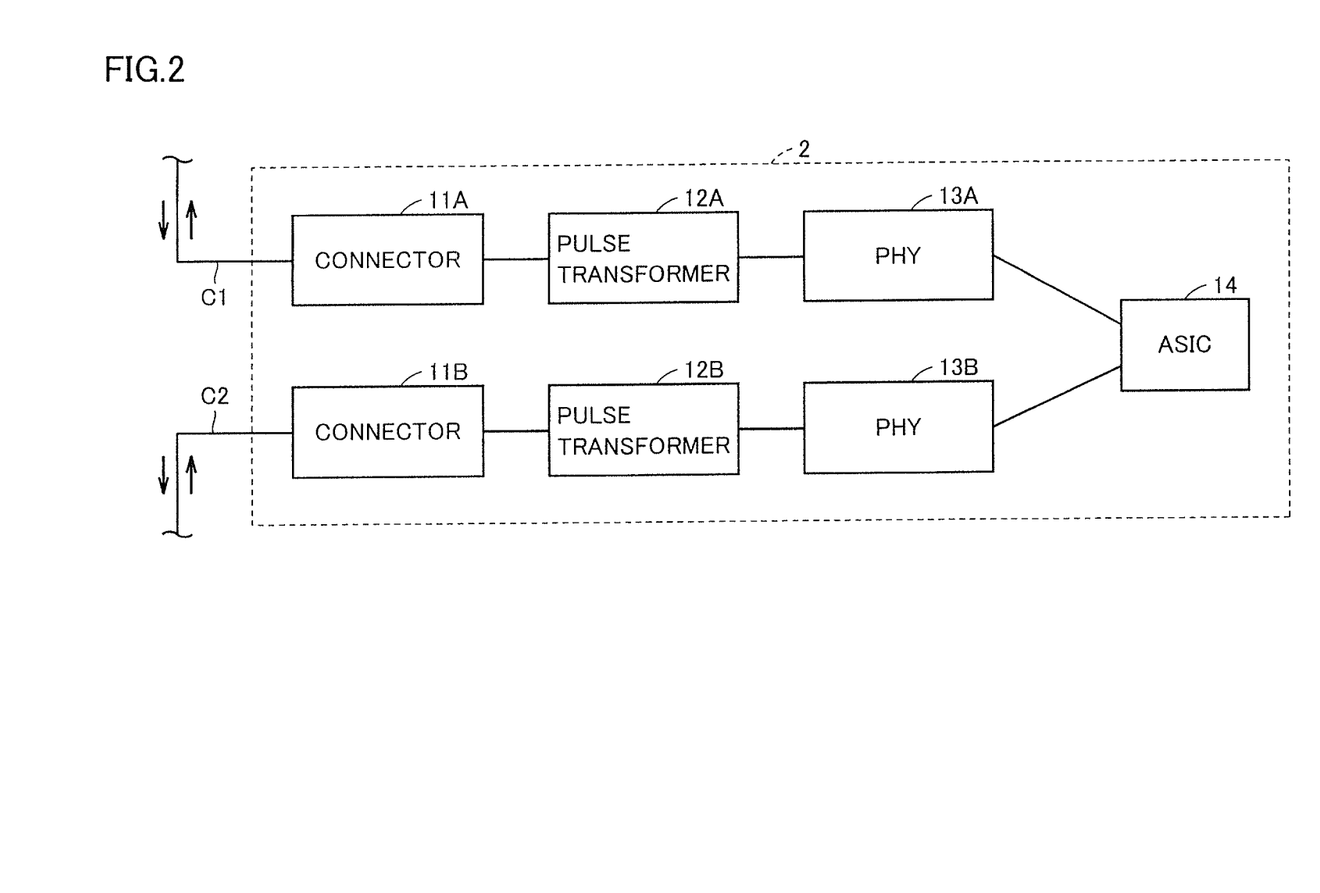
FIG. 2 is a functional block diagram of main components of the network device shown in FIG. 1.

FIG. 2 is a functional block diagram of main components of the network device shown in FIG. 1. Referring to FIG. 2, network device 2 corresponds to each of network devices 2.1 to 2.2 shown in FIG. 1. Network device 2 includes connectors 11A, 11B, pulse transformers 12A, 12B, PHY devices 13A, 13B, and an ASIC (Application Specific Integrated Circuit) 14.

To connectors 11A and 11B, cables C1 and C2 are connected respectively. As described above, in the system according to the embodiment of the present invention, data is circulated among a master (controller 1) and a plurality of slaves (network devices 2.1, 2.2 and servo drivers 4.1, 4.2). Therefore, the received data is input and the data to be transmitted is output to and from connectors 11A, 11B each. Namely, in pulse transformers 12A, 12B each, the direction in which the received data (signal) is sent and the direction in which the data to be transmitted is sent are different from each other.

Figure 3:
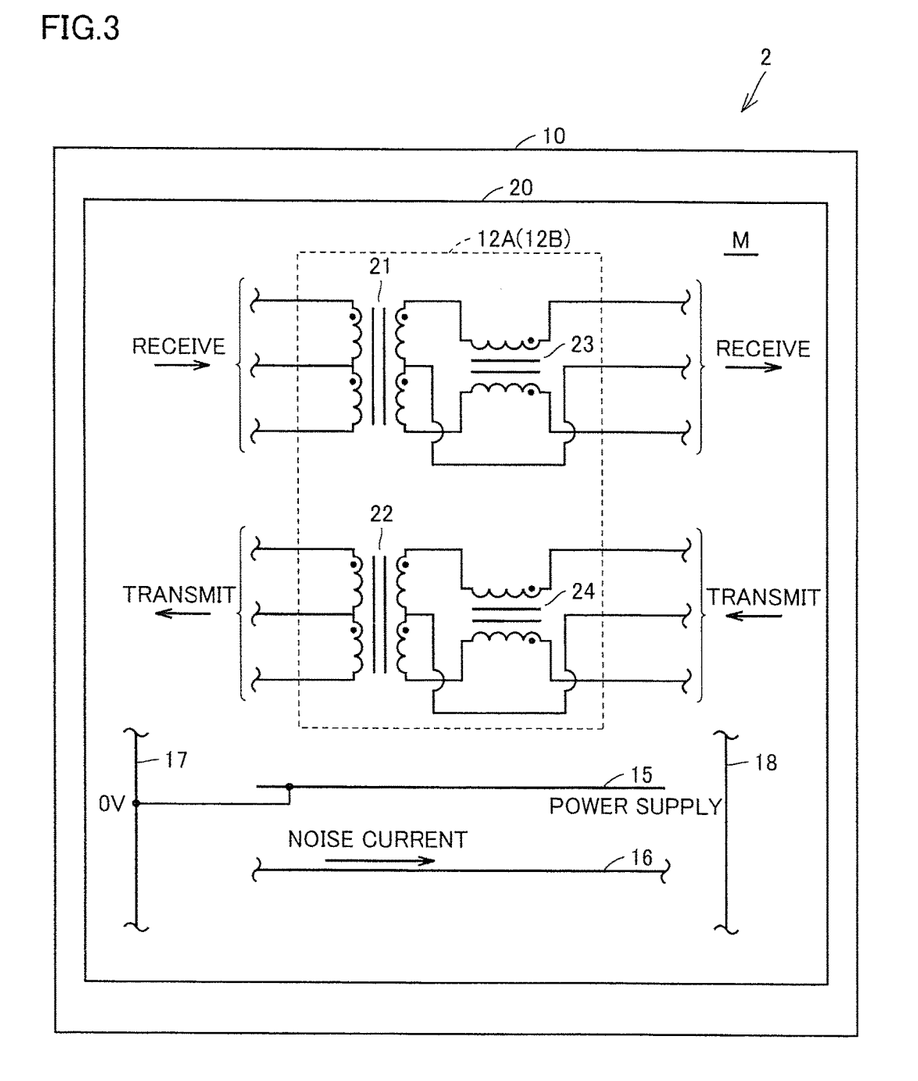
FIG. 3 is a circuit diagram for illustrating pulse transformers 12A, 12B shown in FIG. 2.

FIG. 3 is a circuit diagram for illustrating pulse transformers 12A, 12B shown in FIG. 2. Referring to FIG. 3, network device 2 includes a casing 10 and a communication module M housed in casing 10. Communication module M includes a circuit board 20 as well as connectors 11A, 11B, pulse transformers 12A, 12B, PHY devices 13A, 13B, and ASIC 14 (see FIG. 2) that are mounted on circuit board 20. In FIG. 3, however, pulse transformer 12A is shown among the above-described components of communication module M.

Pulse transformer 12A is a module into which a plurality of transformers are integrated. Specifically, pulse transformer 12A includes transformers 21, 22 and common-mode choke coils 23, 24. Transformers 21, 22 and common-mode choke coils 23, 24 each include a core of a magnetic material and two windings wound around the core. It is noted that pulse transformers 12A, 12B are configured identically to each other. Therefore, the detailed description of the configuration of the pulse transformer will not be repeated for pulse transformer 12B.

Transformers 21, 22 each function as a pulse transformer. Transformer 21 and common-mode choke coil 23 are provided on a reception path for network device 2 to receive a signal through the cable. Transformer 22 and common-mode choke coil 24 are provided on a transmission path for a signal from network device 2 to be transmitted to the cable. It should be noted that the network device according to the embodiment of the present invention is not limited to the network device in which the reception path and the transmission path are fixed as described above. For example, the network device may have the AutoMDI/MDI-X capability. Namely, network device 2 may be configured so that the transmission path and the reception path are exchanged with each other depending on the type of the connected LAN cable.

On circuit board 20, various line patterns are formed in addition to the above-described components. Specifically, on circuit board 20, a noise line pattern 16 is provided for flowing noise current which has entered network device 2 through the cable. This noise line pattern 16 is connected to connector 11A (11B) and also connected to a ground pattern of circuit board 20 through a capacitor (not shown) for example. Noise line pattern 16 may also be connected to connector 11A (11B) and connected to a frame ground pattern.

Further, on circuit board 20, a 0V line 17 and a power supply line 18 are formed each as a line having a fixed potential. The semiconductor integrated circuits such as the above-described PHY devices and ASIC operate with a power supply voltage fed from power supply line 18.

The power supply voltage is not particularly limited. In the case where a plurality of devices with respective power supply voltages different from each other are mounted on circuit board 20, a circuit (such as DC/DC converter) for feeding a power supply voltage appropriate for each device may be mounted on circuit board 20.

Since noise current flows in noise line pattern 16, the noise current can be prevented from directly entering pulse transformers 12A, 12B. It should be noted, however, that a signal transmitted through pulse transformers 12A, 12B may be influenced by noise (electromagnetic noise) generated due to the noise current. Particularly in the case where the area of circuit board 20 is reduced for the sake of downsizing the network device, the distance between noise line pattern 16 and pulse transformer 12A (12) may be shortened.

In view of this, the embodiment of the present invention provides a shield member 15 for protecting pulse transformer 12A (12B) against noise. As described above, in the embodiment of the present invention, the direction of transmitting a signal through pulse transformer 12A (12B) may be switched. In contrast, the measure against noise by means of only an electronic component is provided in most cases on the condition that the direction in which a signal is transmitted is fixed, and therefore, such a measure against noise may be insufficient. Shield member 15 can be provided to effectively prevent noise from entering pulse transformer 12A (12B) even in such a configuration in which the direction in which a signal is transmitted is switched.

Shield member 15 in one form is connected to a line pattern (line) having a fixed potential. FIG. 3 shows the form in which shield member 15 is connected to 0V line 17. It should be noted that shield member 15 may be connected to power supply line 18. Alternatively, shield member 15 may be connected to casing 10. Namely, shield member 15 may be connected to a frame ground (FG).

Further, shield member 15 may be electrically connected to none of the above-described 0V line 17, power supply line 18, and casing 10. Namely, shield member 15 may be in an electrically floating state.

Figure 4:
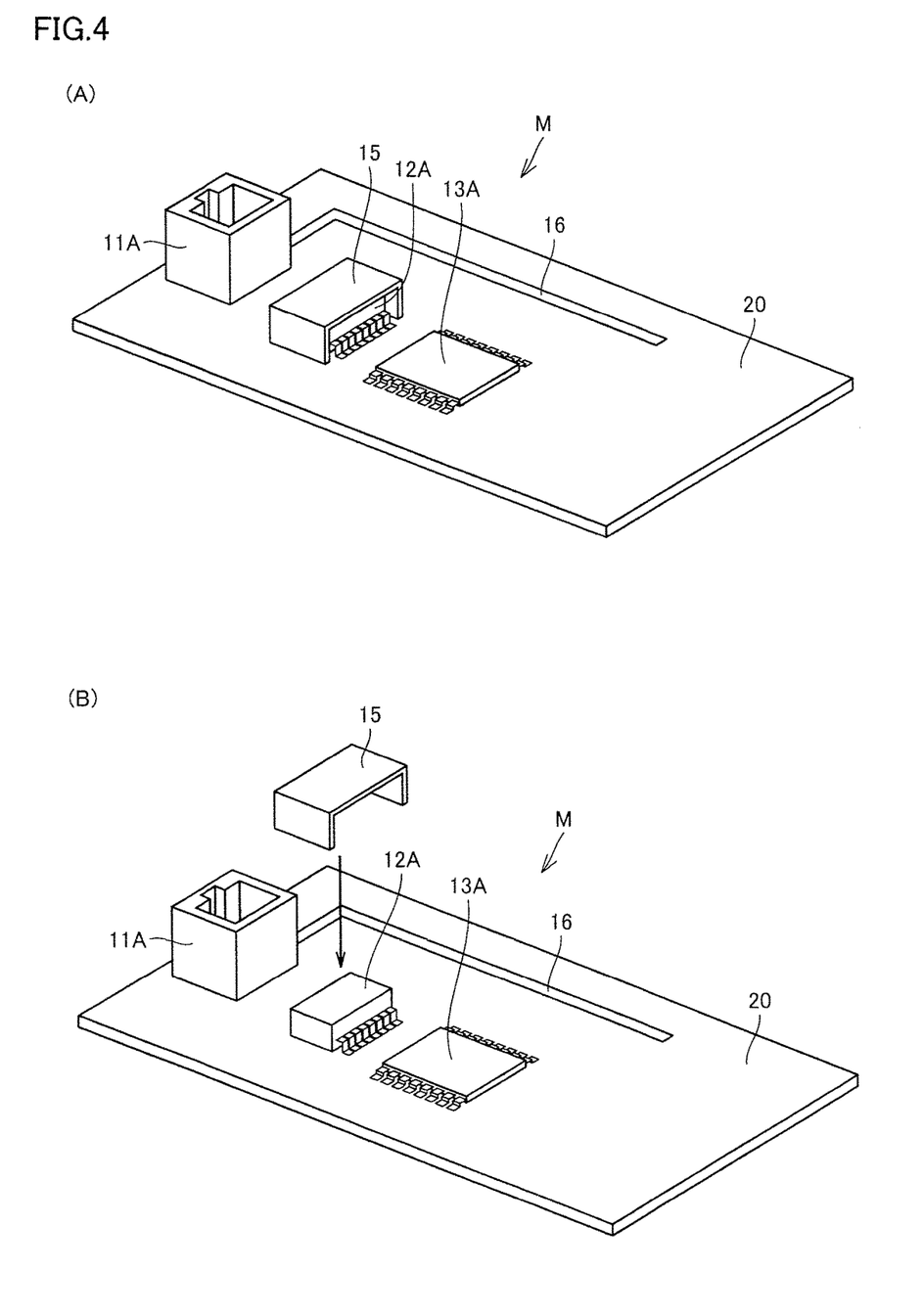
FIG. 4 is a schematic diagram of a circuit board on which a pulse transformer and a shield member are mounted.

FIG. 4 is a schematic diagram of the circuit board on which the pulse transformer and the shield member are mounted. FIG. 4 (A) is a diagram showing a state in which the pulse transformer and the shield member are mounted. FIG. 4 (B) is a diagram showing a state in which the shield member is removed. Referring to FIG. 4 (A) and FIG. 4 (B), on a surface of circuit board 20, connector 11A, pulse transformer 12A, and PHY device 13A for example are mounted. Here, in order to clearly illustrate the positional relation between the pulse transformer and the shield member, FIG. 4 (A) and FIG. 4 (B) do not show connector 11B and pulse transformer 12B. It should be noted that the shield structure for pulse transformer 12B is identical to the structure described below. Therefore, the detailed description of the shield structure will not be repeated for pulse transformer 12B.

On the surface of circuit board 20, noise line pattern 16 is formed for allowing noise current to flow therein. Noise line pattern 16 is formed on the same surface as the surface on which pulse transformer 12A is mounted. It should be noted that a noise line pattern may also be formed on a surface of circuit board 20 opposite to the surface on which pulse transformer 12A is mounted. This line pattern may be formed instead of noise line pattern 16 or formed in addition to noise line pattern 16.

Shield member 15 is provided to cover the top surface and the two side surfaces of pulse transformer 12A. The two side surfaces of pulse transformer 12A are the side surfaces located opposite to each other. One of the two side surfaces is located opposite to noise line pattern 16.

In the embodiment of the present invention, shield member 15 covers pulse transformer 12A, which is a part (a component of the communication module) mounted on circuit board 20, rather than the whole circuit board 20. Accordingly, the area of the shield member can be reduced and hence the cost of the shield member can be reduced. The reduction of the cost of the shield member enables reduction of the cost of the communication module, and consequently the cost of the network device can be reduced.

Shield member 15 may be provided to cover at least a part of pulse transformer 12A, and is not limited to a shield member as shown in FIG. 4 that covers the upper surface and the two side surfaces of the pulse transformer. In the embodiment of the present invention, shield member 15 is provided at a position of effectively blocking noise, and accordingly the area of shield member 15 can be reduced. In this way, an increase of the cost of the shield member can be suppressed and noise can effectively be prevented from entering the pulse transformer. A detailed description of a preferred arrangement of shield member 15 will be given later herein.

Figure 5:
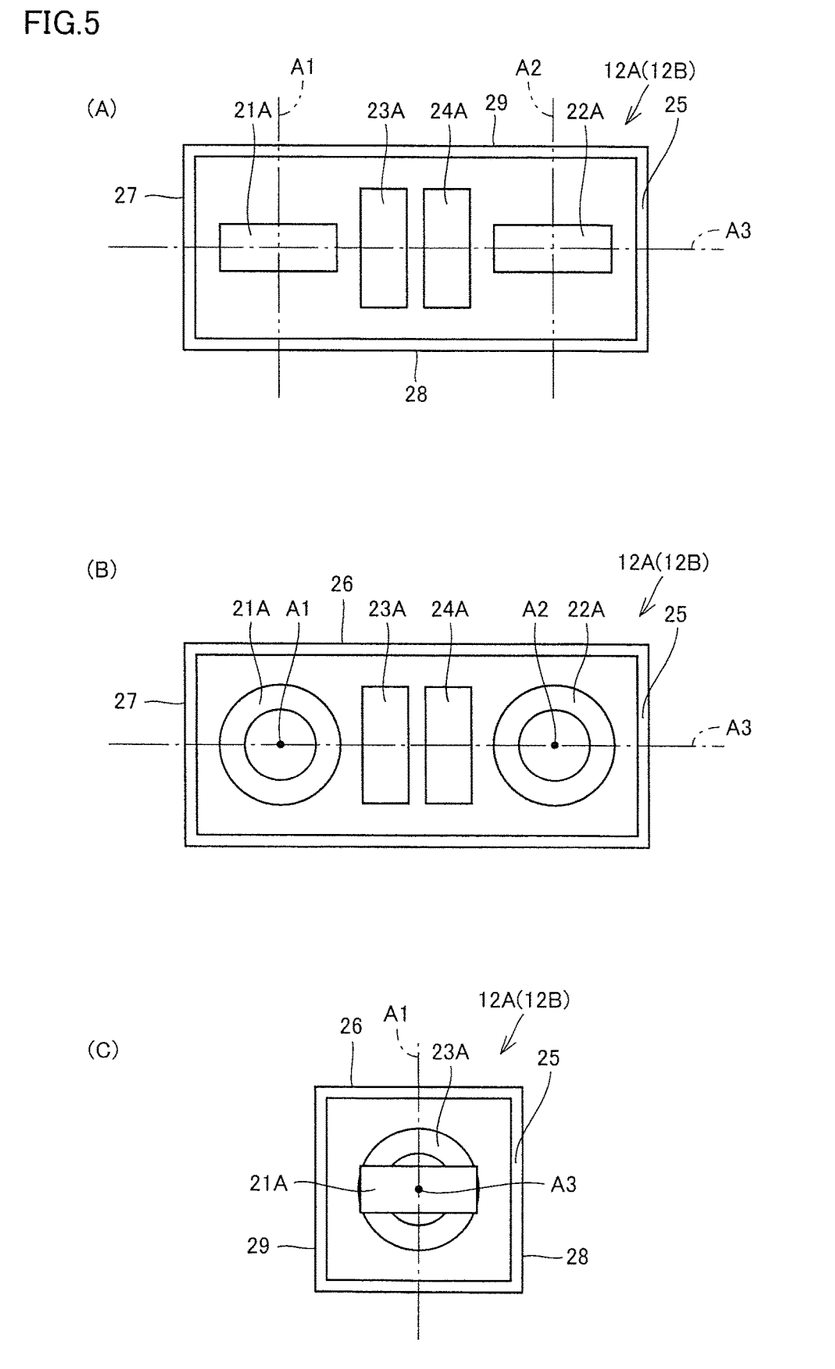
FIG. 5 is a diagram illustrating an example of the arrangement of internal cores of pulse transformer 12A shown in FIG. 4.

FIG. 5 is a diagram illustrating an example of the arrangement of internal cores of pulse transformer 12A shown in FIG. 4. FIG. 5 (A) is a perspective view showing the inside of pulse transformer 12A as seen from the front side. FIG. 5 (B) is a perspective view showing the inside of pulse transformer 12A as seen from above. FIG. 5 (C) is a perspective view showing the inside of pulse transformer 12A as seen from a lateral side. Here, only the cores are shown in FIG. 5 (A) to FIG. 5 (C) for the sake of explaining the arrangement of the cores (which is applied as well to the subsequent drawings). Referring to FIG. 5 (A) to FIG. 5 (C), cores 21A, 22A, 23A, 24A correspond respectively to cores of transformers (pulse transformers) 21, 22 and cores of common-mode choke coils 23, 24. Cores 21A, 22A, 23A, 24A (transformers 21, 22, common-mode choke coils 23, 24) are housed inside a package 25.

Cores 21A, 22A, 23A, 24A are in the shape of a ring. Central axes A1, A2 represent respective central axes of cores 21A, 22A. Central axis A3 represents the central axis of cores 23A, 24A. Cores 21A, 22A, 23A, 24A are arranged so that central axes A1, A2 intersect central axis A3 as seen in a plan view of cores 21A, 22A, 23A, 24A.

Here, FIG. 5 shows an example of the arrangement of the cores and thus the arrangement of the cores is not limited to the one shown in FIG. 5. For example, cores 23A, 24A are not limited to the arrangement in which they are placed concentrically. The arrangement of the cores of the pulse transformers and the cores of the common-mode choke coils is also not limited to the one shown in FIG. 5. For example, cores 21A, 22A, 23A, 24A may also be arranged so that respective central axes of cores 21A, 22A, 23A, 24A are oriented in the same direction. Further, the internal configuration (circuit) of pulse transformer 12A is not limited to the circuit shown in FIG. 3.

Figure 6:
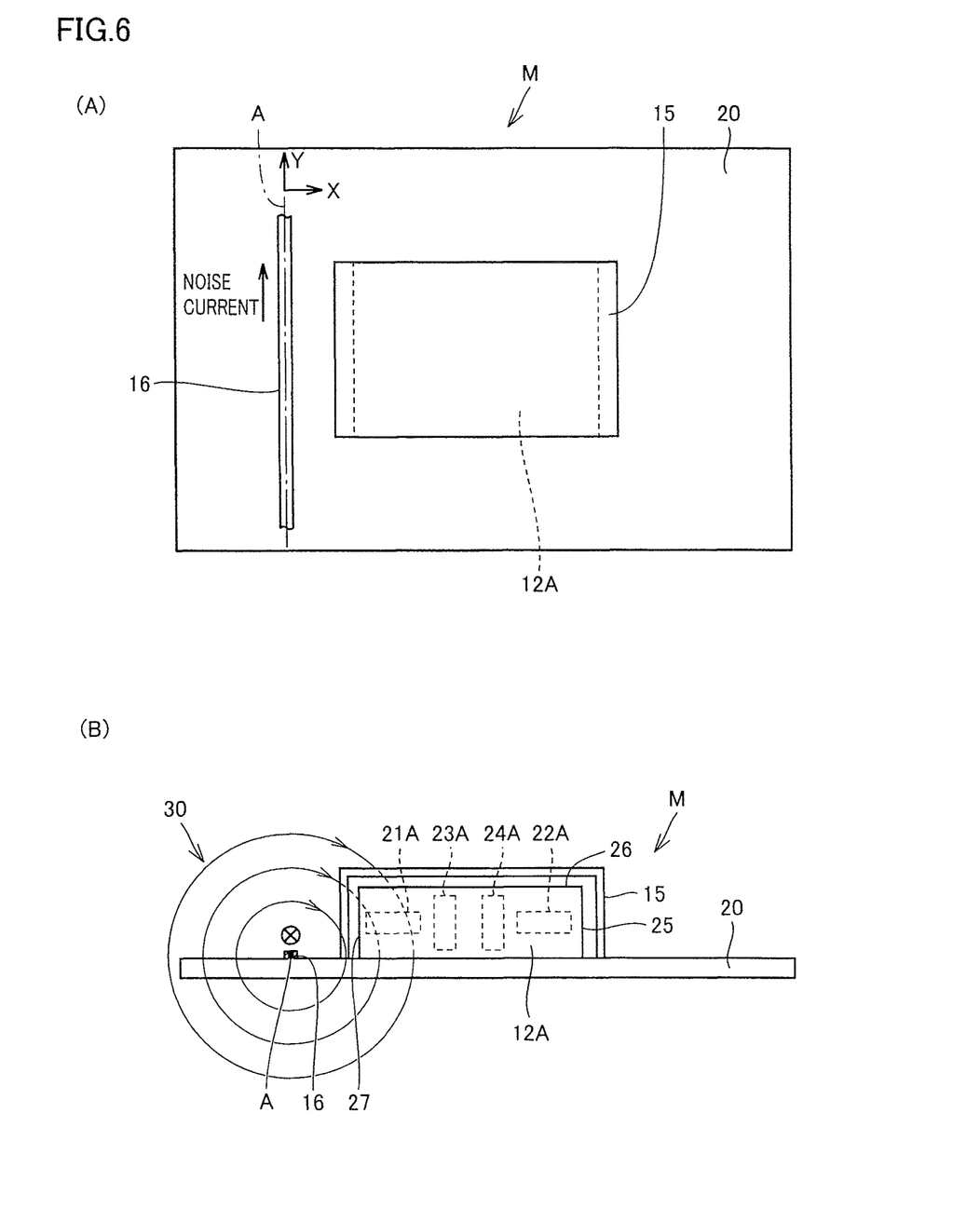
FIG. 6 is a schematic diagram for illustrating an arrangement of a shield member.

FIG. 6 is a schematic diagram for illustrating an arrangement of the shield member. FIG. 6 (A) is a schematic diagram showing a main surface of circuit board 20. FIG. 6 (B) is a diagram showing pulse transformer 12A and shield member 15 as seen in the direction along noise line pattern 16. Referring to FIG. 6 (A) and FIG. 6 (B), noise line pattern 16 is formed linearly along a certain direction (Y direction herein). In the embodiment of the present invention, shield member 15 is arranged so that the shield member covers a surface portion of pulse transformer 12A that intersects concentric circles 30 whose central axis is axis A extending along the direction in which noise current flows (namely Y direction). Therefore, shield member 15 is arranged so that the shield member covers at least a side surface 27 of pulse transformer 12A that is located opposite to noise line pattern 16 and covers an upper surface 26 of pulse transformer 12A. It should be noted that "to intersect concentric circles 30" herein excludes the case where a plane defined by concentric circles 30 and a plane which is parallel with the former plane abut on the surface portion of pulse transformer 12A.

Upper surface 26 of pulse transformer 12A corresponds to the upper surface of package 25 (see FIG. 5) in which a plurality of transformers are housed. Likewise, side surface 27 of pulse transformer 12A corresponds to a side surface of package 25. The fact that shield member 15 covers side surface 27 of pulse transformer 12A corresponds to the fact that shield member 15 is provided between noise line pattern 16 and pulse transformer 12A.

As noise current flows in the noise line pattern, a magnetic field with concentric field lines is generated in accordance with the right-hand rule. In the case where noise current flows in the direction indicated in FIG. 6 (A) and FIG. 6 (B), a magnetic field with field lines in the direction indicated by the arrows on the circumferences of concentric circles 30 is generated. Since shield member 15 is arranged to cover the surface portion of pulse transformer 12A that intersects concentric circles 30, the magnetic field generated due to noise current, namely electromagnetic noise due to noise current, can be prevented from entering pulse transformer 12A.

It is noted that the electromagnetic noise generated due to the noise current is not only the noise due to the magnetic field but also noise due to an electric field. It should be noted that the direction of the magnetic field and the direction of the electric field are orthogonal to each other. This will be explained by means of FIG. 6 (B). In the case where the magnetic field has the direction along the circumferences of the concentric circles, the electric field has the direction orthogonal to a tangent to the circumference. Namely, the direction of the magnetic field and the direction of the electric field are two directions orthogonal to each other on the same plane. Therefore, shield member 15 is arranged to cover the surface portion of pulse transformer 12A that intersects concentric circles 30 as described above to enable not only the influence of the noise due to the magnetic field but also the influence of the noise due to the electric field to be reduced.

It is noted that concentric circles 30 are located on a plane which is different from the two side surfaces (side surfaces 28, 29 shown in FIG. 5) of pulse transformer 12A that are orthogonal to side surface 27, and thus concentric circles 30 do not intersect these side surfaces 28, 29. Meanwhile, side surfaces 28, 29 of pulse transformer 12A abut on an imaginary plane defined by concentric circle 30 or a plane which is parallel with the former plane. As described above, this state is not included in the state of "intersecting concentric circles 30" in the embodiment of the present invention. Therefore, shield member 15 is not provided for side surfaces 28, 29 of pulse transformer 12A. Although shield member 15 may be provided to cover the whole of pulse transformer 12A as a matter of course, shield member 15 may cover upper surface 26 and side surface 27 of pulse transformer 12A, which are more effective portions for addressing noise, and thus noise can effectively be suppressed while the cost of shield member 15 is reduced.

In the case where noise line pattern 16 is arranged linearly along the direction turned by 90° relative to the direction indicated in FIG. 6 (A), namely arranged linearly along the X direction, shield member 15 may be arranged to be oriented in the direction turned by 90° relative to the arrangement shown in FIG. 6 (A). Namely, in this case, shield member 15 may be arranged so that upper surface 26 of pulse transformer 12A and a side surface (side surface 28 or 29) which is located opposite to noise line pattern 16 may be covered with the shield member.

Figure 7:
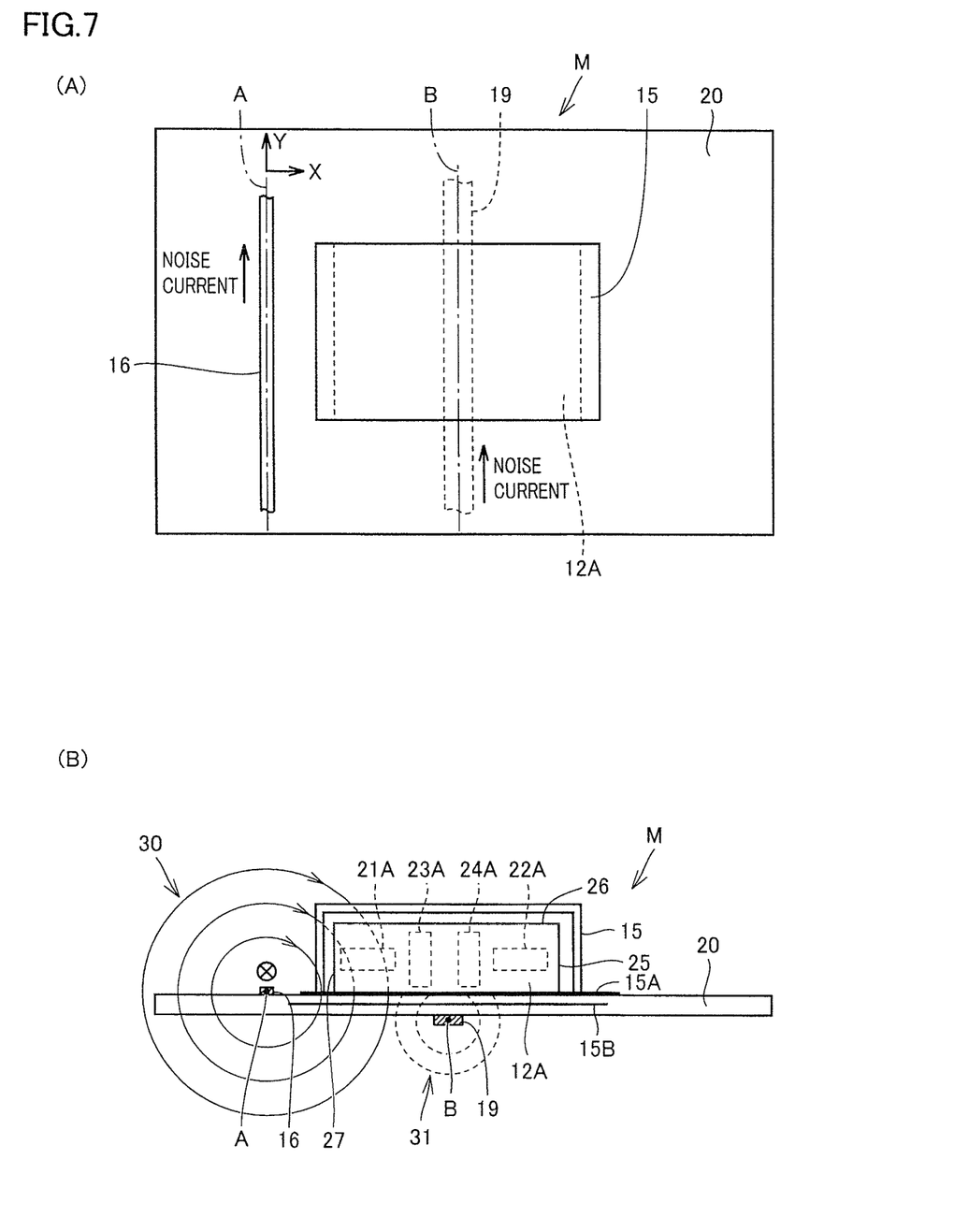
FIG. 7 is a schematic diagram for illustrating another form of the arrangement of the shield member.

Further, as described above, a noise line pattern may also be formed on the surface of circuit board 20 that is opposite to the surface on which pulse transformer 12A is mounted. FIG. 7 is a schematic diagram for illustrating another form of the arrangement of the shield member. FIG. 7 (A) is a schematic diagram showing a main surface of circuit board 20. FIG. 7 (B) is a diagram showing pulse transformer 12A and shield member 15 as seen in the direction along noise line pattern 16.

Referring to FIG. 7 (A) and FIG. 7 (B), a noise line pattern 19 is formed in addition to noise line pattern 16 on circuit board 20. Noise line pattern 19 is located on the surface of circuit board 20 that is opposite to noise line pattern 16, and formed linearly along the Y direction.

As shown in FIG. 7 (A) and FIG. 7 (B), noise line pattern 19 in an example is arranged to overlap pulse transformer 12A as seen from above the circuit board 20. A shield member 15A is arranged to cover a surface portion of pulse transformer 12A that intersects concentric circles 31 whose central axis is axis B extending along the direction in which noise current flows (namely Y direction), namely cover the bottom surface of pulse transformer 12A. Shield member 15A can be used to prevent electromagnetic noise (noise due to magnetic field or electric field) generated due to noise current flowing in noise line pattern 19 from entering pulse transformer 12A.

Since the condition that the shield member is provided between noise line pattern 19 and pulse transformer 12A may be satisfied, shield member 15B may also be arranged inside circuit board 20 as shown in FIG. 7 (B). Further, only one of shield members 15A, 15B may be provided or both of them may be provided.

In the case where noise line pattern 19 is arranged along the direction turned by 90° relative to the arrangement shown in FIG. 7 (A) (namely in the case where noise line pattern 19 is formed along the X direction), the above-described shield member 15A and/or shield member 15B can also be used to prevent electromagnetic noise due to noise current flowing in noise line pattern 19 from entering pulse transformer 12A.

In accordance with the embodiment of the present invention, even in the case where electromagnetic noise is generated due to noise current flowing outside the network device, the possibility that the electromagnetic noise enters the pulse transformer can also be reduced. The noise generated outside the network device may be noise due to noise current flowing in a metal plate around the network device, or noise due to noise current flowing in a member (such as DIN rail) used for attaching the network device. In this case as well, a shield member can be arranged to cover a surface portion of the pulse transformer that intersects concentric circles having the central axis extending along the direction in which the noise current flows, and thereby reduce the possibility that the electromagnetic noise enters the pulse transformer.

As seen from the above, in accordance with the embodiment of the present invention, a portion of the pulse transformer that is particularly vulnerable to noise can be covered with a shield member to effectively suppress, at a low cost, noise entering the pulse transformer.

In connection with the embodiment of the present invention, the configuration for addressing noise of network devices 2.1, 2.2 each has been illustrated. The configuration shown in FIGS. 3 to 7, however, may also be applied to the servo drivers shown in FIG. 1.

Further, in connection with the embodiment of the present invention, the configuration has been illustrated including two transformers (namely the pulse transformer provided on the reception path and the pulse transformer provided on the transmission path) as well as shield members provided in association with these transformers. The shield structure of the present invention, however, is also applicable to the case where only the pulse transformer on the reception path is provided or the case where only the pulse transformer on the transmission path is provided. Namely, the present invention is applicable to the case where at least one pulse transformer is provided, and the number of pulse transformers is not particularly limited.

Furthermore, while the above embodiment illustrates the devices applied to industrial communication networks, the present invention is applicable widely to network devices including pulse transformers. The use of the present invention is therefore not particularly limited to the network devices of which an industrial communication network is constructed.

Moreover, the type of network devices to which the present invention is applicable is not limited. For example, the present invention may also be applied to switching HUB, router or the like. Further, as long as the network device is connected to a communication network, the present invention is applicable as well to wired LAN adapter, wired LAN card, wired LAN board and the like. The devices such as wired LAN adapter described above are configured to include communication module M shown in FIGS. 3 to 7. Further, the present invention is applicable to any network devices as described above, namely applicable to both the device in which the transmission path and the reception path are fixed and the device having the AutoMDI/MDI-X capability.

It should be construed that the embodiment disclosed herein is by way of illustration in all respects, not by way of limitation. It is intended that the scope of the present invention is defined by claims and encompasses all modifications and variations equivalent in meaning and scope to the claims.

REFERENCE SIGNS LIST 1 controller; 2.1, 2.2 network device; 3.1-3n input/output device; 4.1, 4.2 servo driver; 5 servo motor; 10 casing; 11A, 11B connector; 12A, 12B pulse transformer; 13A, 13B PHY device; 15, 15A, 15B shield member; 16, 19 noise line pattern; 17 0V line; 18 power supply line; 20 circuit board; 21, 22 transformer; 21A, 22A, 23A, 24A core; 23, 24 common-mode choke coil; 25 package; 26 upper surface; 27, 28, 29 side surface; 30, 31 concentric circles; 100 network system; A, B axis; A1, A2, A3 central axis; C1, C2 cable; M communication module.

The invention claimed is:

1. A network device provided on a communication network and transmitting a signal via a communication cable, comprising: a circuit board configured to transmit a signal and having a ground pattern; at least one connector provided on the circuit board, the at least one connector being configured to transmit and receive data from a cable; at least one transformer module provided on a signal transmission path of the circuit board, the at least one transformer module having a plurality of ring-shaped cores provided therein, wherein a first pair of the ring-shaped cores have central radial axes perpendicular to a top surface of the circuit board and wherein a second pair of the ring-shaped cores have central radial axes parallel to a top surface of the circuit board; a shield member having a shape conforming to an outer profile of the at least one transformer module to prevent noise, which is generated due to noise current, from entering the at least one transformer module, the shield member being spaced apart from the at least one connector, wherein the shield member covers at least a part of a surface of the at least one transformer module, wherein substantially an entire region of the circuit board, which is outside of an area of the circuit board on which the at least one transformer module is mounted, is uncovered by the shield member, wherein the part of the surface of the at least one transformer module intersects concentric circles, and wherein the concentric circles represent a magnetic field generated by the noise current and have a central axis extending along a direction in which the noise current flows; and wherein the circuit board includes a line pattern that passes the noise current entering the network device, wherein the line pattern is connected to the at least one connector and connected to the ground pattern of the circuit board, wherein the line pattern is positioned entirely outside of the shield member, and wherein the line pattern that passes the noise current extends in a direction of a side of the shield member that covers a side of the transformer module that is located opposite to the line pattern so as to shield the side of the transformer module from the line pattern, wherein the central radial axes of at least one of the first pair and the second pair of the ring-shaped cores are oriented perpendicular to the central axis of the concentric circles.

2. The network device according to claim 1, wherein the at least one pulse transformer comprises: a first pulse transformer configured to pass a signal received by the network device via the communication cable; and a second pulse transformer configured to pass a signal transmitted from the network device to the communication cable.

3. The network device according to claim 2, wherein the first and second pulse transformers are housed in a package mounted on the circuit board, and the shield member covering an upper surface of the package and a side of the package that is located opposite to the line pattern, wherein the side of the package defines the side of the transformer module.

4. The network device according to claim 1, wherein the shield member is electrically connected to a node having a fixed potential.

5. The network device according to claim 1, wherein the shield member is mounted on the circuit board in a state where the shield member is electrically floated.

6. A communication module transmitting a signal via a communication cable, comprising: a circuit board configured to transmit a signal and having a ground pattern; at least one connector provided on the circuit board, the at least one connector being configured to transmit and receive data from a cable; at least one transformer module mounted on the circuit board and provided on a signal transmission path, the at least one transformer module having a plurality of ring-shaped cores provided therein, wherein a first pair of the ring-shaped cores have central radial axes perpendicular to a top surface of the circuit board and wherein a second pair of the ring-shaped cores have central radial axes parallel to a top surface of the circuit board; a shield member having a shape conforming to an outer profile of the at least one transformer module to prevent noise, generated due to noise current, from entering the at least one transformer module, the shield member being spaced apart from the at least one connector, wherein the shield member covers at least a part of a surface of the at least one transformer module, wherein substantially an entire region of the circuit board, which is outside of an area of the circuit board on which the at least one transformer module is mounted, is uncovered by the shield member, wherein the part of the surface of the at least one transformer module intersects concentric circles, and wherein the concentric circles represent a magnetic field generated by the noise current and have a central axis extending along a direction in which the noise current flows; and wherein the circuit board includes a line pattern that passes the noise current entering the communication module, wherein the line pattern is connected to the at least one connector and connected to the ground pattern of the circuit board, wherein the line pattern is positioned entirely outside of the shield member, and wherein the line pattern that passes the noise current extends in a direction of a side of the shield member that covers a side of the transformer module that is located opposite to the line pattern so as to shield the side of the transformer module from the line pattern, wherein the central radial axes of at least one of the first pair and the second pair of the ring-shaped cores are oriented perpendicular to the central axis of the concentric circles.

7. The network device according to claim 1, comprising: a zero voltage line provided on the circuit board, wherein the shield member is connected to the zero voltage line.

8. The communication module according to claim 6, comprising:

a zero voltage line provided on the circuit board, wherein the shield member is connected to the zero voltage line.

* * * * *

UNITED STATES PATENT AND TRADEMARK OFFICE
CERTIFICATE OF CORRECTION

PATENT NO. : 9,723,767 B2
APPLICATION NO. : 13/550953
DATED : August 1, 2017
INVENTOR(S) : T. Kojima et al.

It is certified that error appears in the above-identified patent and that said Letters Patent is hereby corrected as shown below:

In the Claims

Column 12, Line 5 (Claim 2, Line 2) please change "one pulse transformer comprises" to -- one transformer module comprises --

Signed and Sealed this
Seventh Day of November, 2017

Joseph Matal
*Performing the Functions and Duties of the*
*Under Secretary of Commerce for Intellectual Property and*
*Director of the United States Patent and Trademark Office*